US012575369B2

(12) United States Patent
Hino et al.

(10) Patent No.: US 12,575,369 B2
(45) Date of Patent: Mar. 10, 2026

(54) ELECTRODE-EMBEDDED MEMBER WITH PIN-SHAPED PROJECTIONS OF VARYING HEIGHTS, SUBSTRATE HOLDING MEMBER, CERAMIC HEATER, AND ELECTROSTATIC CHUCK

(71) Applicant: NGK SPARK PLUG CO., LTD., Nagoya (JP)

(72) Inventors: Makoto Hino, Nagoya (JP); Hiroaki Suzuki, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 1022 days.

(21) Appl. No.: 17/703,419

(22) Filed: Mar. 24, 2022

(65) Prior Publication Data

US 2022/0319897 A1 Oct. 6, 2022

(30) Foreign Application Priority Data

Mar. 30, 2021 (JP) ................................. 2021-058336
Dec. 28, 2021 (JP) ................................. 2021-214820

(51) Int. Cl.
*H10P 72/72* (2026.01)
*H05B 3/14* (2006.01)
(52) U.S. Cl.
CPC ........... *H10P 72/722* (2026.01); *H05B 3/143* (2013.01)
(58) Field of Classification Search
CPC ........... H01L 21/6833; H01L 21/68792; H01L 21/6875; H01L 21/67103; H01L 21/68757;

(Continued)

(56) References Cited

U.S. PATENT DOCUMENTS 6,483,690 B1 * 11/2002 Nakajima ........... H01L 21/6833
361/234
2002/0102512 A1 8/2002 Yamaguchi
(Continued)

FOREIGN PATENT DOCUMENTS

JP 2002-124367 A 4/2002
JP 2005-109169 A 4/2005
(Continued)

OTHER PUBLICATIONS

Taiwan Bureau of Intellectual Property, Office Action issued in corresponding Application No. 111111845, dated Mar. 22, 2023.
(Continued)

*Primary Examiner* — John P. Dulka
(74) *Attorney, Agent, or Firm* — Stites & Harbison, PLLC; Jeffrey A. Haeberlin

(57) ABSTRACT

An electrode-embedded member includes a disc-shaped base that is formed of a ceramic sintered body, an electrode embedded in the base, and a plurality of pin-shaped projections projecting upward from an upper surface of the base. The upper surface of the base is a curved surface having a shape protruding toward a center. The plurality of pin-shaped projections include first pin-shaped projections whose heights from the upper surface to respective upper ends are substantially identical to each other, and second pin-shaped projections whose heights from the upper surface to respective upper ends are each lower than the height of each of the first pin-shaped projections.

5 Claims, 7 Drawing Sheets

(58) Field of Classification Search
     CPC . H01L 21/687; H05B 3/143; H05B 2203/017;
                                      H05B 3/12; H05B 3/283
     See application file for complete search history.

(56)                        References Cited

U.S. PATENT DOCUMENTS

| | | |
|---|---|---|
| 2005/0082274 A1 | 4/2005 | Kondou et al. |
| 2006/0102595 A1 | 5/2006 | Inoue |
| 2020/0135530 A1* | 4/2020 | Shah ...................... H05B 3/283 |
| 2020/0303229 A1* | 9/2020 | Ozaki ................ H01L 21/6833 |
| 2021/0006182 A1 | 1/2021 | Maeta |

FOREIGN PATENT DOCUMENTS

| | | | |
|---|---|---|---|
| JP | 2016139649 A | * | 8/2016 |
| JP | 2020-035905 A | | 3/2020 |
| KR | 20060049383 A1 | | 5/2006 |
| KR | 20110116515 A1 | | 10/2011 |
| TW | 202036754 A | | 10/2020 |
| WO | 2020/170514 A1 | | 8/2020 |

OTHER PUBLICATIONS

Korean Intellectual Property Office, Office Action (Request for the
Submission of an Opinion) issued in corresponding Application No.
KR 10-2022-0136208 issued Aug. 12, 2024.
Japan Patent Office, Office Action (Notice of Reasons for Refusal)
issued in corresponding Application No. JP 2022-155474, issued
Jul. 4, 2025.

* cited by examiner

ELECTRODE-EMBEDDED MEMBER WITH PIN-SHAPED PROJECTIONS OF VARYING HEIGHTS, SUBSTRATE HOLDING MEMBER, CERAMIC HEATER, AND ELECTROSTATIC CHUCK

BACKGROUND OF THE INVENTION

1. Field of the Invention

The present invention relates to an electrode-embedded member, a substrate holding member, a ceramic heater, and an electrostatic chuck.

2. Description of the Related Art

As a member for a semiconductor manufacturing apparatus, an electrode-embedded member in which an electrode (a heating resistor) is embedded has been used. The electrode-embedded member can heat a placed substrate. The electrode-embedded member is required to have a property of uniformly heating a heating surface, and various suggestions have been made.

PTL 1 discloses a substrate heating device in which a heating surface of a ceramic base on which a substrate is to be placed has a protruding surface shape that is highest at a center portion and that becomes lower toward a peripheral portion. This improves adhesion to a substrate at the center portion, at which heat escapes easily due to heat transfer from a shaft, and thereby equalizes a temperature distribution on the heating surface.

PTL 2 discloses a ceramic heater in which a heating surface includes emboss portions that are to be in contact with a substrate. PTL 2 describes that a heat spot having a relatively high surface temperature is generated on the heating surface when an average temperature of the heating surface has increased to an intended temperature. In the ceramic heater described in PTL 2, the number of the emboss portions per unit area at the heat spot is less than that in areas other than the heat spot to reduce an influence exerted by the heat spot on the substrate.

3. Patent Literature

PTL 1: Japanese Unexamined Patent Application Publication No. 2005-109169
PTL 2: Japanese Unexamined Patent Application Publication No. 2002-124367

SUMMARY OF THE INVENTION

In recent years, there is a demand for not only uniformly heating a heating surface but also providing a temperature gradient, for example, to precisely control a thin-film deposition distribution at each position in a substrate, which requires a technology capable of providing a desired temperature gradient in a radial direction while equalizing a temperature distribution by suppressing a local temperature distribution, such as a hot spot or a heat spot, that exerts an adverse effect on a substrate.

In PTL 1, equalization of a temperature distribution on the heating surface is considered; however, suppression of a local temperature distribution, such as a hot spot or the like, and provision of a desired temperature gradient in a radial direction are not considered. In PTL 2, an influence exerted by a heat spot on a substrate is reduced; however, provision of a desired temperature gradient in a radial direction is not considered.

The present invention has been made in consideration of such circumstances. An object of the present invention is to provide an electrode-embedded member, a substrate holding member, a ceramic heater, and an electrostatic chuck in which it is possible to equalize a local temperature distribution and possible to provide a predetermined temperature gradient.

In accordance with one aspect of the present invention, a disc-shaped base includes (i.e., is formed of) a ceramic sintered body, an electrode embedded in the base, and a plurality of pin-shaped projections that project upward from an upper surface of the base. The upper surface of the base is a curved surface having a shape protruding toward a center of the base. The plurality of pin-shaped projections include first pin-shaped projections whose heights from the upper surface to respective upper ends are substantially identical to each other, and second pin-shaped projections whose heights from the upper surface to respective upper ends are each lower than the height of each of the first pin-shaped projections. The second pin-shaped projections are disposed in a ring-shaped area in the upper surface surrounded by concentric circles centered at the center.

By thus providing the second pin-shaped projections lower than the first pin-shaped projections in the ring-shaped area when a placement surface formed by the upper ends of the first pin-shaped projections is a curved surface having a protruding shape, it is possible to equalize a local temperature distribution on a substrate and possible to provide a predetermined temperature gradient in a radial direction.

In one implementation, $\Delta H > \Delta G \geq 0.5 \times \Delta H$ is satisfied where $\Delta G$ is a difference between the height of each of the first pin-shaped projections and the height of, among the second pin-shaped projections, the second pin-shaped projection whose height is lowest, and $\Delta H$ is a difference in a vertical direction between the upper end of the first pin-shaped projection that is closest to the center of the base and the upper end of the first pin-shaped projection that is closest to an outer edge of the base.

By the second pin-shaped projections thus being lower by a certain amount or more, it is possible, in the electrode-embedded member that causes the base to attract a substrate, to suppress contact between the substrate and the second pin-shaped projections even when the substrate is deformed by an attractive force. Consequently, it is possible to reduce a likelihood that temperature control of a substrate above the second pin-shaped projections becomes complicated in consideration of presence/absence of contact between the second pin-shaped projections and the substrate.

In another implementation, with a vertical straight line that passes through the center of the base being set as a center axis, when a placement curved surface constituted by the upper ends of the first pin-shaped projections is cut by mutually orthogonal two cross-sections that pass through the center axis to obtain two profile curves, a determination coefficient $R^2$ with respect to an approximate expression when one of the profile curves is subjected to quadratic curve approximation and a determination coefficient $R^2$ with respect to an approximate expression when another of the profile curves is subjected to quadratic curve approximation are each 0.99 or more.

Consequently, it is possible to constitute a placement curved surface having a protruding shape that has a highly center-symmetric property and possible to improve a property of uniformly heating a substrate in the circumferential direction and to easily perform equalization of a local temperature distribution on the substrate and control of provision of a predetermined temperature gradient.

In accordance with another aspect of the invention, a substrate holding member includes the electrode-embedded member as described above, and a supporting member is bonded to a lower surface of the base opposite to the upper surface and that supports the electrode-embedded member.

Consequently, it is possible to adjust the ring-shaped area in accordance with the size, the position, the thermal conductivity, and the like of the supporting member and possible also in the substrate holding member to equalize a local temperature distribution on a substrate and to provide a predetermined temperature gradient.

In accordance with yet another aspect of the invention, a ceramic heater includes the substrate holding member described above, and the electrode is a heater electrode.

Consequently, it is possible to adjust the ring-shaped area in accordance with the size, the position, the thermal conductivity, and the like of the supporting member and possible also in the ceramic heater to equalize a local temperature distribution on a substrate and to provide a predetermined temperature gradient.

In accordance with still yet another aspect of the invention, an electrostatic chuck includes the substrate holding member described above, the electrode is a heater electrode, and the substrate holding member further includes an electrostatic attraction electrode.

Consequently, it is possible to adjust the ring-shaped area in accordance with the size, the position, the thermal conductivity, and the like of the supporting member and possible also in the electrostatic chuck to equalize a local temperature distribution on a substrate and to provide a predetermined temperature gradient.

An electrode-embedded member, a substrate holding member, a ceramic heater, and an electrostatic chuck according to the present invention are capable of equalizing a local temperature distribution and capable of providing a predetermined temperature gradient.

DESCRIPTION OF THE PREFERRED EMBODIMENTS

Figure 1:
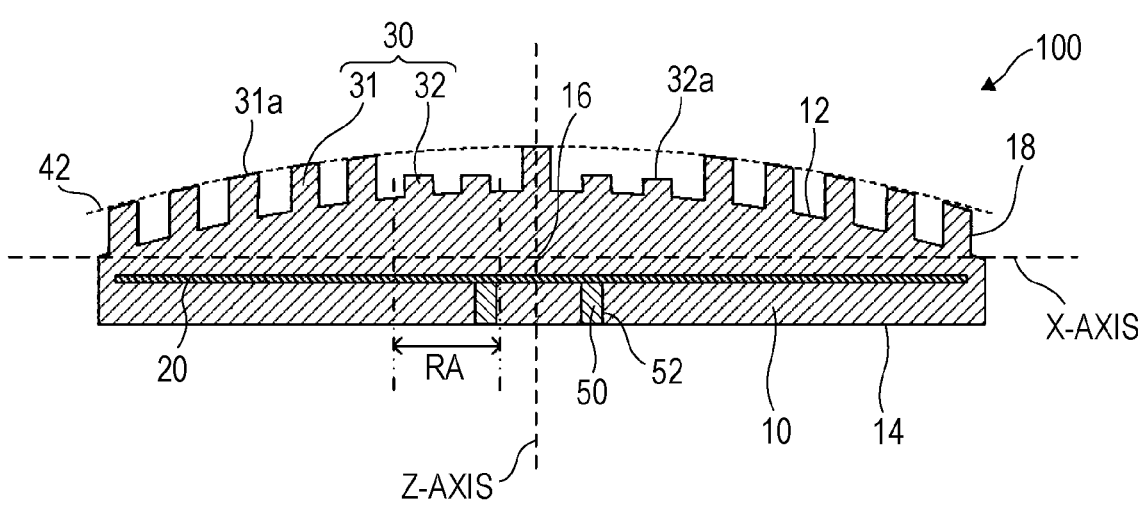
FIG. 1 is a schematic sectional view illustrating one example of an electrode-embedded member according to an embodiment of the present invention.

Next, an embodiment of the present invention will be described with reference to the drawings. For ease of understanding of description, the same reference numbers are given to the same components in the drawings, and duplicated description is omitted. The configuration diagrams illustrate the sizes of components conceptually and do not necessarily illustrate actual dimension ratios.

1. Embodiment a. Configuration of Electrode-Embedded Member

Figure 2:
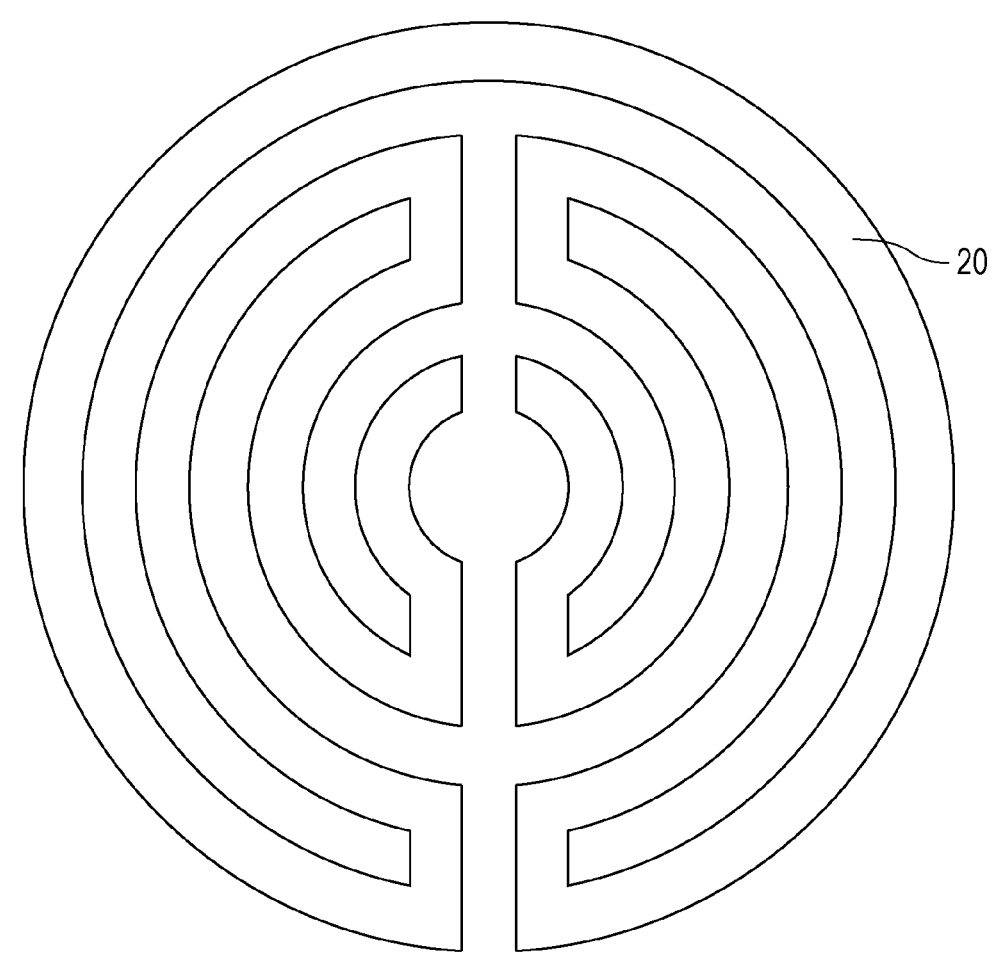
FIG. 2 is a schematic view illustrating one example of an upper surface of an electrode that is to be embedded in an electrode-embedded member according to an embodiment.
Figures 3, 4:
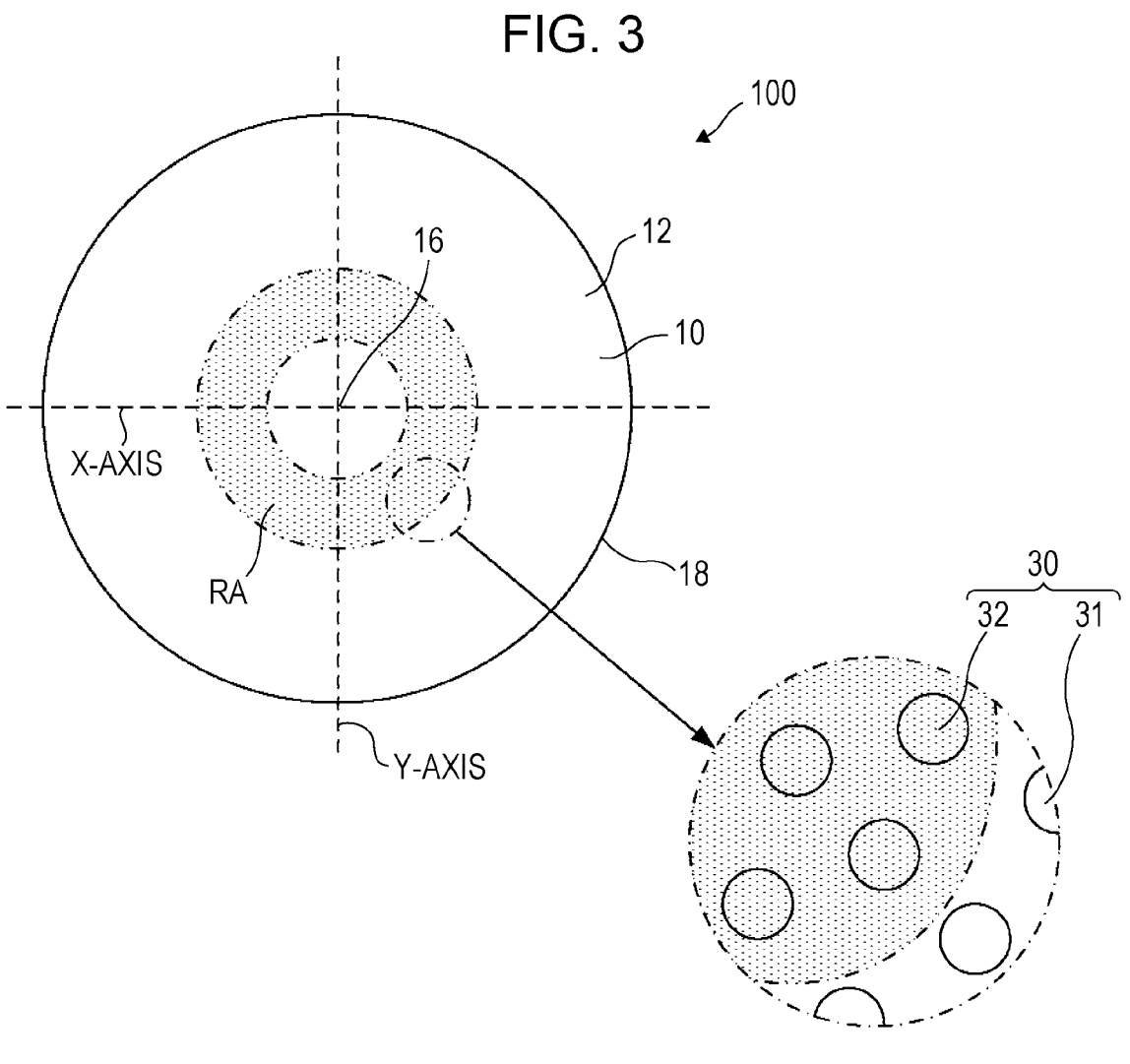
FIG. 3 is a schematic view illustrating one example of an upper surface of an electrode-embedded member according to an embodiment of the present invention.
FIG. 4 is a schematic view illustrating one example of an electrode-embedded member according to an embodiment of the present invention.
Figure 5:
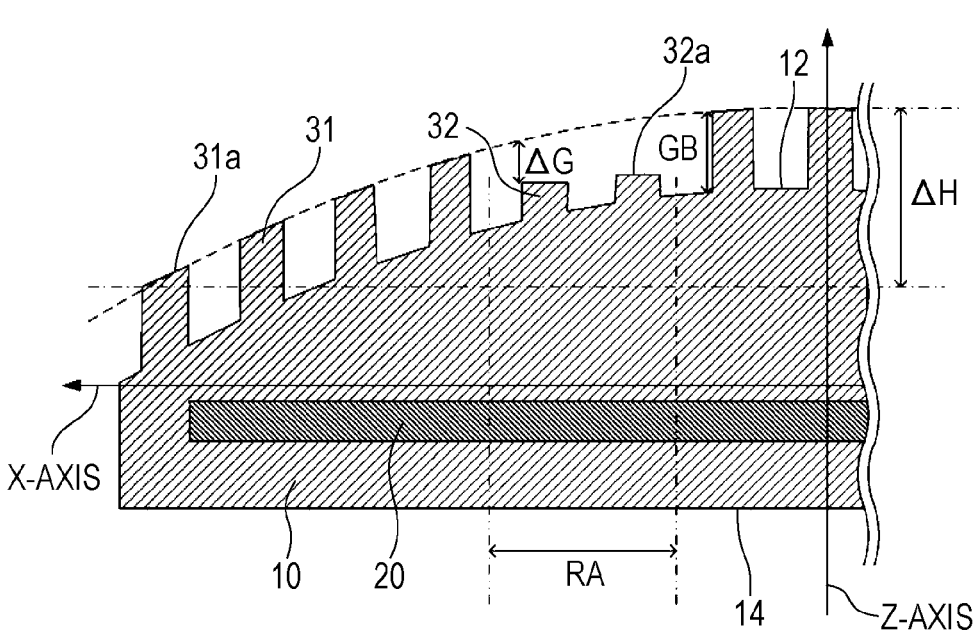
FIG. 5 is a schematic partial sectional view illustrating one example of an electrode-embedded member according to an embodiment of the present invention.

An electrode-embedded member according to an embodiment of the present invention will be described with reference to FIG. 1 to FIG. 5. FIG. 1 is a schematic sectional view illustrating one example of an electrode-embedded member according to an embodiment of the present invention. FIG. 2 is a schematic view illustrating one example of an upper surface of an electrode according to an embodiment of the present invention. FIG. 3 is a schematic view and a partially enlarged view illustrating one example of an upper surface of an electrode-embedded member according to an embodiment of the present invention. FIG. 4 is a schematic partial sectional view illustrating one example of an electrode-embedded member according to an embodiment of the present invention. FIG. 5 is a schematic partially enlarged sectional view illustrating one example of an electrode-embedded member according to an embodiment of the present invention. In the partial sectional view, a terminal 50 and a terminal hole 52 are omitted. An electrode-embedded member 100 according to the present embodiment includes a base 10, an electrode 20, and pin-shaped projections 30 that include first pin-shaped projections 31 and second pin-shaped projections 32.

The base 10 is formed of a ceramic sintered body and has a substantially disc shape in which an upper surface 12 of the base 10 is a curved surface having a shape protruding toward a center 16. The base 10 has a shape in which the center 16 of the base 10 is naturally determined.

The electrode 20 is embedded in the base 10. The electrode 20 is used as a heater electrode for heating a substrate W (wafer). The terminal 50 is connected to a position at both ends of the electrode 20. Electrodes for the other uses, for example, an electrostatic attraction electrode or a high-frequency electrode may be additionally embedded.

The electrode 20 may have any shape and may have a shape, such as that illustrated in FIG. 2, including a plurality of circumferential patterns. A temperature distribution or a local hot spot on a heating surface of the base 10 may be generated depending on the shape of the electrode 20. For example, when the shape of the electrode 20 is a shape, such as that in FIG. 2, in which a plurality of circumferential patterns are connected to each other, a temperature difference is not easily generated in the circumferential direction but is easily generated in the radial direction in a temperature distribution on the heating surface. The electrode-embedded member 100 according to the present invention is, however, possible to reduce or control this.

As illustrated in FIG. 1, a plurality of the pin-shaped projections 30 project upward from the upper surface 12 of the base 10. The shape of each pin-shaped projection 30 is selected, as appropriate, from columnar shapes such as a circular column shape and a rectangular column shape, conical shapes such as a cone shape and a pyramid shape, conical shapes whose upper portions are truncated such as a truncated cone shape and a truncated pyramid shape, and the like.

Figures 8, 9:
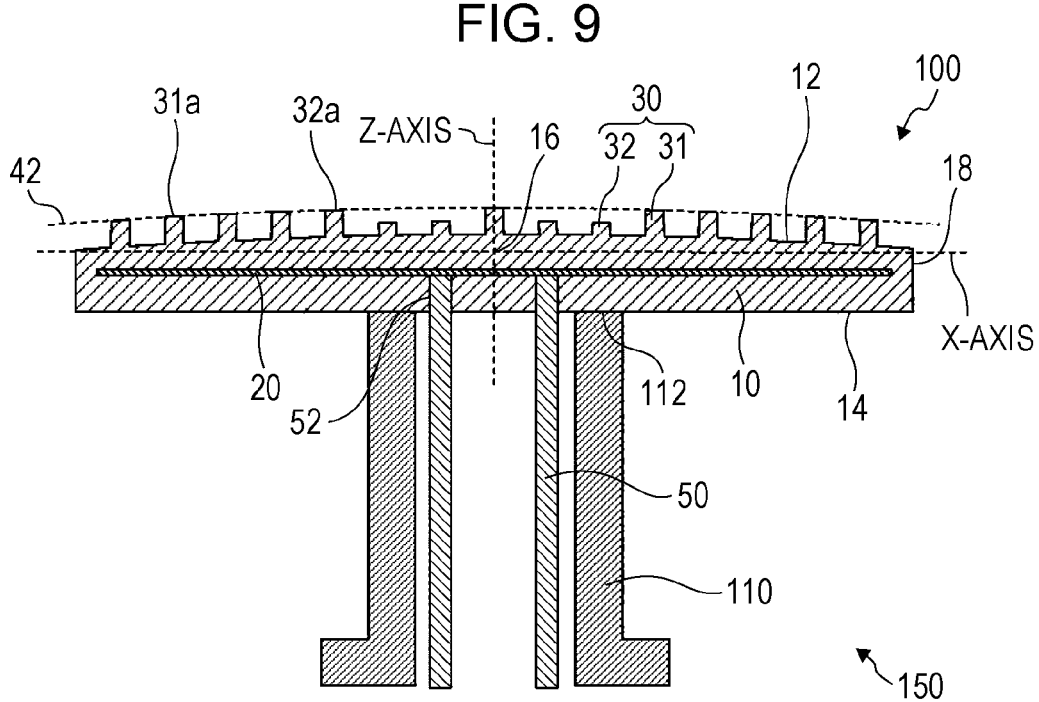
FIG. 8 is a schematic partial sectional view illustrating one example of an upper surface of a modification of an electrode-embedded member according to an embodiment of the present invention.
FIG. 9 is a schematic sectional view illustrating one example of a substrate holding member according to an embodiment of the present invention.

The arrangement of the pin-shaped projections 30 is not particularly limited. As long as being in a known form or a form similar to a known form, the arrangement may be a regular arrangement in, for example, a concentric form, a square lattice form, a triangular lattice shape, or the like or may be even an irregular arrangement in which sparseness and density are generated locally. Preferably, the arrangement is in a concentric form as illustrated in FIG. 8. With a concentric arrangement, a temperature distribution in the radial direction is easily controlled.

As described above, the pin-shaped projections 30 include the first pin-shaped projections 31 and the second pin-shaped projections 32. As illustrated in FIG. 1, the first pin-shaped projections 31 are formed such that the heights of the first pin-shaped projections 31 from the upper surface 12 of the base 10 to respective upper ends 31a are substantially identical to each other. The second pin-shaped projections 32 are arranged in a ring-shaped area RA, such as that illustrated in FIG. 1 and FIG. 3. The heights of the second pin-shaped projections 32 from the upper surface 12 to respective upper ends 32a are lower than the height of each of the first pin-shaped projections 31.

As illustrated in FIG. 4, the upper ends 31a of the first pin-shaped projections form as a whole a curved surface (placement curved surface) having a predetermined shape on which the substrate W is to be placed. With this curved surface, the first pin-shaped projections 31 support the substrate W. In other words, a placement curved surface formed by the upper ends 31a of the first pin-shaped projections is defined. Consequently, the upper ends 31a of the first pin-shaped projections and the substrate W abut each other, and the substrate W is supported. In FIG. 4, the whole surfaces of the upper ends 31a of the first pin-shaped projections abut the substrate W. However, only part of the upper ends 31a of the first pin-shaped projections may abut the substrate W.

The upper ends 32a of the second pin-shaped projections may be in contact with the substrate W but may be not necessarily in contact with the substrate W. Even when the upper ends 32a are in contact with the substrate W, the contact pressure is smaller than that of the first pin-shaped projections 31. Therefore, heat transfer to the substrate W is smaller than in an area in which the first pin-shaped projections 31 are formed. Meanwhile, even when the upper ends 32a are not in contact with the substrate W, heat transfer to the substrate W is larger than when the pin-shaped projections are not provided since the upper ends 32a of the second pin-shaped projections are closer than the upper surface 12 to the substrate W.

The ring-shaped area RA is an area surrounded by concentric circles centered at the center 16. The ring-shaped area RA is an area in which heat transferability from the electrode 20 is intended to be lower than in the other areas in the base 10. The ring-shaped area RA is, for example, an area showing a local temperature distribution such as a hot spot or a heat spot, an area in which heat transferability is required to be low to provide a desired temperature gradient, or the like. Due to the pin-shaped projections 30 disposed in the ring-shaped area RA being formed by the second pin-shaped projections 32, which are lower than the first pin-shaped projections 31, it is possible to equalize a local temperature distribution, in particular, equalize a local temperature distribution generated in the radial direction and possible to provide a predetermined temperature gradient in the radial direction. The second pin-shaped projections 32 may be disposed in areas other than the ring-shaped area RA.

Instead of only one, a plurality of the ring-shaped areas RA may be provided with respect to one base 10. As illustrated in FIG. 3, the number of the second pin-shaped projections 32 included in the ring-shaped area RA in the radial direction may be two or more (for example, double or more when the projections are formed concentrically) or may be one. In the radial direction, the ring-shaped area RA including two or more second pin-shaped projections 32 makes it easy to equalize a local temperature distribution. In the radial direction, the ring-shaped area RA including one second pin-shaped projection 32 makes it easy to perform minute temperature distribution control.

Since the heights of the first pin-shaped projections 31 from the upper surface 12 of the base 10 to the respective upper ends 31a of the first pin-shaped projections 31 are substantially identical to each other, the placement curved surface formed by the upper ends 31a of the first pin-shaped projections 31 is formed by a curved surface that is substantially identical to the curved surface of the upper surface 12 of the base 10. That is, the placement curved surface is substantially identical to a curved surface obtained by moving the curved surface formed by the upper surface 12 of the base 10 perpendicularly by an amount of the height of each first pin-shaped projection 31. Consequently, it is possible to equalize an attraction force when using the electrode-embedded member 100 as a member of a type that attracts the substrate W.

With the center axis (a straight light passing through the center 16 of the base 10 and perpendicular to a reference surface of the base 10) of the base 10 being set as a Z-axis, when the placement curved surface formed by the upper ends 31a of the first pin-shaped projections 31 is cut by a cross-section passing through the Z-axis to obtain a profile curve 42, and when a line of intersection between a predetermined reference surface and a cross section is set as an X-axis, the profile curve 42 is a curve, such as that illustrated in FIG. 5, having a value of Z that is maximum in the vicinity of the center axis and that decreases monotonously toward an outer edge 18 of the base 10.

The predetermined reference surface is, of the upper surface 12 of the base 10, a horizontal surface passing through a point at a position closest to a horizontal surface. A surface obtained as a result of upward or downward parallel translation of these horizontal surfaces may be set as a reference surface. The vicinity of the center axis denotes a range within 25 mm from the center axis.

Due to the profile curve 42 of the placement curved surface being a curve having the value of Z that is maximum in the vicinity of the center axis and that decreases monotonously toward the outer edge 18 of the base 10, the following ability of the substrate W with respect to the first pin-shaped projections 31 is improved compared with when the placement curved surface is nearly a flat surface with increased flatness, and it is possible to reduce generation of a local hot spot. In addition, since the substrate W is supported by the first pin-shaped projections 31, it is possible to suppress particles from being caught and possible, as necessary, to use a space below the substrate W as a flow path for a gas.

The placement curved surface can be estimated by measuring the upper ends 31a of the first pin-shaped projections with a three-dimensional measuring instrument. However, it is important that the substrate W when the substrate W is placed on or attracted by the electrode-embedded member 100 follows the placement curved surface and causes the shape of a surface (a surface of the substrate W) on the side opposite to the side of the placement curved surface for the substrate W to be an ideal curved surface. Therefore, in a curved surface obtained by measuring, by a laser interferometer, the surface on the side opposite to the side of the placement curved surface when a silicon wafer having a thickness of 0.775 mm is placed on or attracted by the placement curved surface, a surface in an area except for the ring-shaped area RA can be estimated as the placement curved surface. The same applies to the profile curve 42. The placement curved surface may be measured in a range of 5 mm to 10 mm inside from the outer edge 18 of the base 10. This is because a measurement error may be large at a position close to the outer edge 18.

The flatness of the placement curved surface is preferably 50 $\mu$m or less. Consequently, it is possible to place the substrate W without causing a crease in the substrate W. The flatness of the placement curved surface is a difference that is obtained by deducting the minimum value from the maximum value of Z at all points on the placement curved surface. The lower limit of the flatness varies depending on the diameter of the base 10 and an intended shape of the placement curved surface. Preferably, the lower limit of the flatness is, for example, 5 $\mu$m or more.

When a curve obtained by cutting the placement curved surface by a second cross-section perpendicular to the X-axis and including the Z-axis is set as a second profile curve, and when a line of intersection between a predetermined reference surface and the second cross-section is set as a Y-axis, a determination coefficient $R^2$ with respect to a first approximate expression when the profile curve is subjected to quadratic curve approximation and a determination coefficient $R^2$ with respect to a second approximate expression when the second profile curve is subjected to quadratic curve approximation are each preferably 0.99 or more. Consequently, the profile curve in the x-axis direction and the y-axis direction can have a quadratic curve shape, and a local irregular change in the height direction of the profile curve can be suppressed. It is thus possible to further reduce generation of a local hot spot. To obtain the determination coefficient $R^2$, a regression sum of squares may be divided by a total sum of squares. The regression sum of squares is a sum of squared deviation of an estimated value of an objective variable. The total sum of squares is a sum of squared deviation of an observed value of the objective variable. Approximation of the profile curve may be limited in a range of 5 mm to 10 mm inside the outer edge 18 of the base 10.

It is preferable that $2(a(X)-a(Y))/(a(X)+a(Y))\leq0.1$ be satisfied where a quadratic coefficient of the first approximate expression is a(X), a quadratic coefficient of the second approximate expression is a(Y), the unit of Z is $\mu$m, and the units of X and Y is mm. Consequently, a curved surface having an excellent symmetric property with respect to the Z-axis is formed, and a local irregular change in the profile curve in the height direction can be suppressed across the whole surface. It is thus possible to suppress generation of a hot spot. Positive/negative of a(X) and a(Y) are the same.

The height of each of the first pin-shaped projections 31 is preferably 5 $\mu$m or more and 300 $\mu$m or less and more preferably 50 $\mu$m or more and 200 $\mu$m or less. The height of each of the first pin-shaped projections 31 denotes a distance from the upper surface 12 of the base 10 to the respective upper ends 31a of the pin-shaped projections. The upper ends 31a of the pin-shaped projections 31 are each preferably a flat surface having a predetermined size. In this case, the maximum diameter of the flat surface of each of the upper ends 31a of the first pin-shaped projections 31 is preferably 50 $\mu$m or more and 5000 $\mu$m or less. A surface roughness Ra of the flat surface of each of the upper ends 31a of the first pin-shaped projections 31 is preferably 0.1 $\mu$m or more and 1.2 $\mu$m or less.

The second pin-shaped projections 32 may have any heights as long as being lower than the first pin-shaped projections 31. The second pin-shaped projections 32 may include the pin-shaped projections 30 having different heights. In other words, the heights of the second pin-shaped projections 32 may be not necessarily equal to each other. Note that the height of each of the second pin-shaped projections 32 is a height at the respective upper ends 32a of the second pin-shaped projections 32 in a position closest to the outer edge 18 of the base 10.

It is preferable that $\Delta H>\Delta G\geq0.5\times\Delta H$ be satisfied where, as illustrated in FIG. 5, $\Delta G$ is a difference between the height of each first pin-shaped projection 31 and the height of, among the second pin-shaped projections 32, the second pin-shaped projection whose height is lowest, and $\Delta H$ is a difference in the vertical direction between the upper end 31a of the first pin-shaped projection 31 closest to the center 16 of the base 10 and the upper end 31a of the first pin-shaped projection 31 closest to the outer edge 18 of the base 10. Due to the second pin-shaped projections 32 being thus lower by a certain amount or more, it is possible, even when the substrate W is deformed by an attractive force, to cause the substrate W not to be easily in contact with the second pin-shaped projections 32. Consequently, it is possible to reduce a likelihood that temperature control of the substrate W above the second pin-shaped projections 32 becomes complicated in consideration of presence/absence of contact between the second pin-shaped projections 32 and the substrate W.

Figure 6:
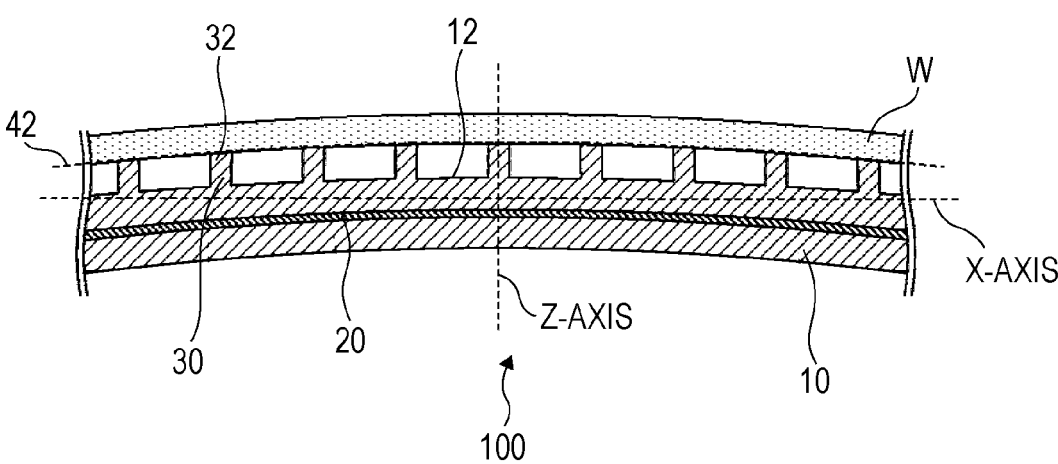
FIG. 6 is a schematic partial sectional view illustrating one example of a modification of an electrode-embedded member according to an embodiment of the present invention.

Regarding the shape of the base 10, a lower surface 14 of the base 10 may be formed by a curved surface that is substantially identical to the placement curved surface, as illustrated in FIG. 6. Consequently, it is possible to make the thickness of the base 10 uniform.

Figure 7:
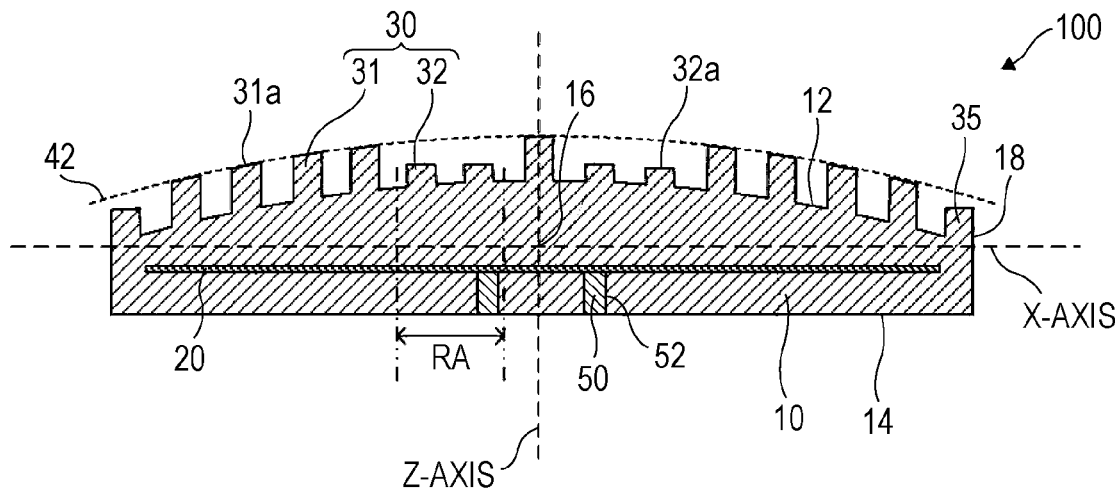
FIG. 7 is a schematic partial sectional view illustrating one example of a modification of an electrode-embedded member according to an embodiment of the present invention.

The electrode-embedded member 100 may include the terminal 50, the terminal hole 52, a lift pin hole (not illustrated), and, if used as a vacuum chuck, an air hole, an annular projection 35, such as that illustrated in FIG. 7 and FIG. 8, and the like for the vacuum chuck.

b. Configuration of Substrate Holding Member

Next, a configuration of a substrate holding member according to an embodiment of the present invention will be described. FIG. 9 is a schematic sectional view illustrating one example of a substrate holding member according to an embodiment of the present invention. A substrate holding member 150 according to the present embodiment includes the electrode-embedded member 100 and a supporting member 110. The basic configuration of the electrode-embedded member 100 is as described above.

The supporting member 110 is formed of a ceramic sintered body and supports the electrode-embedded member 100. Consequently, the substrate holding member 150 is applied to a heater with a shaft, an electrostatic chuck with a shaft, and the like. The supporting member 110 is bonded via a bonding surface 112 to a predetermined position in the lower surface 14 opposite to the upper surface 12 of the electrode-embedded member 100. Bonding may be solid phase bonding or may be bonding using a bonding material. The supporting member 110 is preferably formed of a ceramic sintered body including a main component identical to that of the base 10 of the electrode-embedded member 100.

The supporting member 110 may have any shape as long as the electrode-embedded member 100 can be supported. The shape is preferably a cylindrical shape. In the substrate holding member 150, due to heat transfer between the electrode-embedded member 100 and the supporting member 110, a temperature distribution localization or a local hot spot may be generated on the heating surface of the base 10 depending on the shape of the supporting member 110. For example, when the shape of the supporting member 110 is a cylindrical shape, a temperature distribution on the heating surface is easily generated in the radial direction. However, the substrate holding member 150 according to the present invention can reduce and control the temperature distribution. The cylindrical shape includes a shape provided with a flange and the like.

c. Configuration of Ceramic Heater

Figure 11:
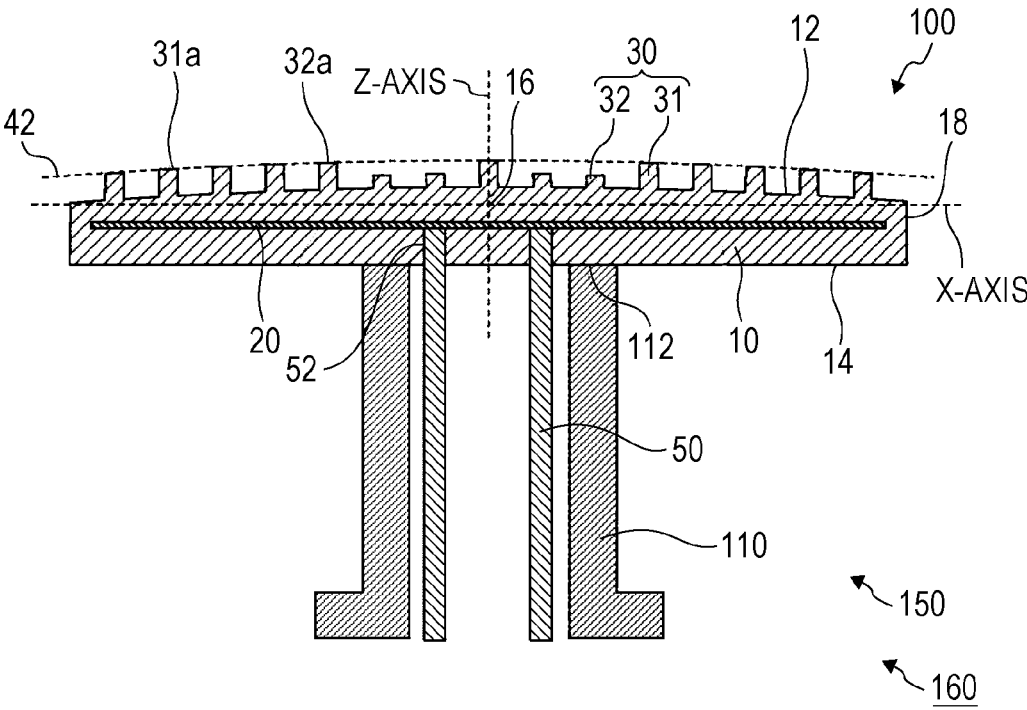
FIG. 11 is a schematic sectional view illustrating one example of a ceramic heater according to an embodiment of the present invention.

Next, a configuration of a ceramic heater according to an embodiment of the present invention will be described with reference to FIG. 11. A ceramic heater 160 according to the present embodiment includes the substrate holding member 150. The electrode 20 is a heater electrode. The basic configuration of the substrate holding member 150 is as described above. Consequently, it is possible to adjust the ring-shaped area in accordance with the size, the position, the thermal conductivity, and the like of the supporting member 110 and possible also in the ceramic heater 160 to equalize a local temperature distribution on the substrate W and to provide a predetermined temperature gradient.

d. Configuration of Electrostatic Chuck

Figure 12:
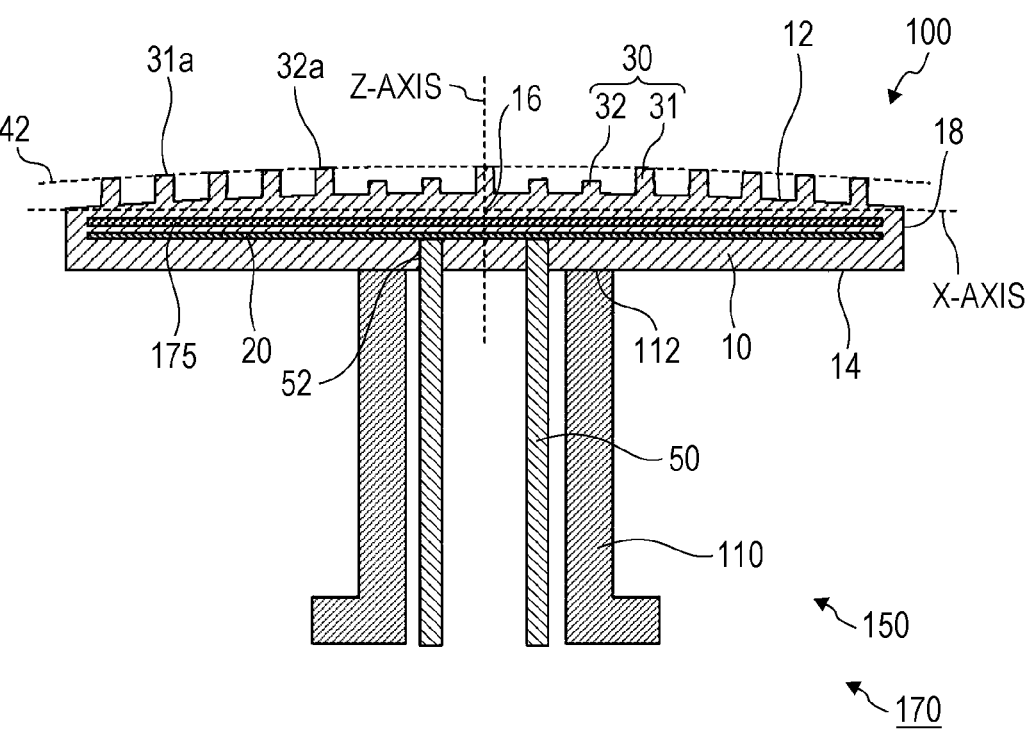
FIG. 12 is a schematic sectional view illustrating one example of an electrostatic chuck according to an embodiment of the present invention.

Next, a configuration of an electrostatic chuck according to an embodiment of the present invention will be described. FIG. 12 is a schematic sectional view illustrating one example of an electrostatic chuck according to an embodiment of the present invention. An electrostatic chuck 170 according to the present embodiment includes the substrate holding member 150. The electrode 20 is a heater electrode. The substrate holding member 150 further includes an electrostatic attraction electrode 175. The basic configuration of the substrate holding member 150 is as described above. Consequently, it is possible to adjust the ring-shaped area in accordance with the size, the position, the thermal conductivity, and the like of the supporting member 110 and possible also in the electrostatic chuck 170 to equalize a local temperature distribution on the substrate W and to provide a predetermined temperature gradient. In FIG. 12, a terminal and the like connected to the electrostatic attraction electrode 175 are omitted.

2. Method of Manufacturing Electrode-Embedded Member

Next, a method of manufacturing an electrode-embedded member according to an embodiment of the present invention will be described. An electrode-embedded member according to an embodiment of the present invention is manufactured by, for example, powder hot press method. The powder hot press method is a method in which ceramic row material powder and a predetermined electrode are alternately stacked to embed the electrode in the inside of ceramic and are subjected to uniaxial hot press baking. Employing powder hot press method enables manufacture in a short period. The method is not limited to this method and may be, for example, the compact hot press method disclosed in U.S. Pat. No. 6,148,845, a conventional green sheet lamination method, or the like.

For example, a ceramic row material (slurry) is prepared by mixing additives such as a sintering additive, a binder, a plasticizer, and a dispersant, as appropriate, into ceramic powder, and granulated powder is formed by a spray drying method or the like. Either of a wet mixing method and a dry mixing method may be employed, and, for example, a mixer such as a ball mill or a vibration mill is usable. As ceramic powder to be used as a row material, silicon carbide, aluminum oxide, aluminum nitride, silicon nitride, or the like is used.

Preferably, ceramic powder has high purity of preferably 96% or more and more preferably 98% or more. Although different depending on the type of ceramic powder to be used as a row material, the average particle diameter of ceramic powder is, for example, preferably 0.1 μm or more and 1.0 μm or less and more preferably 0.3 μm or more and 0.8 μm or less.

As the material of the electrode embedded in the ceramic sintered body, Mo or W is preferably used.

Regarding sintering, uniaxial hot press baking or normal-pressure baking is usable. In uniaxial hot press baking, granulated powder for forming a base is packed in a bottomed carbon mold, and an electrode that has been cut to a predetermined shape after uniaxial pressing is disposed on a compact. Preferably, hot press baking is performed for 0.1 hours or more and 20 hours or less under a temperature condition of 1700° C. or more and 2000° C. or less and a pressure condition of 1 MPa or more and 20 MPa or less after molding with the same granulated powder packed thereon and a punch of the carbon mold placed.

After baking, grinding and sanding to forms a predetermined shape are performed in addition to processing of surface that becomes the upper ends of the first pin-shaped projections of the base, formation of the plurality of pin-shaped projections, processing of the back surface, and formation of the terminal hole. To form the pin-shaped projections, processing of a surface of the base that becomes the upper ends of the first pin-shaped projections is first performed, and then, the second pin-shaped projections are formed after the first pin-shaped projections are formed.

The surface of the base that becomes the upper ends of the first pin-shaped projections is processed to be a curved surface having a protruding shape in which a profile curve obtained by cutting the surface by a cross-section passing through the center axis is substantially line symmetrical with respect to the center axis and has a value of Z that is maximum in the vicinity of the center axis and that decreases monotonously toward the outer edge of the base. This formation is performed to satisfy that, preferably, ΔH is 5 μm or more and 50 μm or less and more preferably 10 μm or more and 20 μm or less. An example of the method of forming the upper surface of the base is a method in which a curved surface is formed by lapping after grinding the surface. The formation also can be performed by MC processing.

Next, the curved surface shape of the surface of the base that becomes the upper ends of the first pin-shaped projections is measured by a three-dimensional measuring instrument. As a result of measurement, when the curved surface shape is a predetermined protruding shape substantially symmetrical with respect to the center axis, formation of the upper surface of the base is finished. The upper surface of the base is subjected to sanding or grinding such that the curved surface shape has a predetermined protruding shape substantially symmetrical with respect to the center axis, as a result of measurement. Then, the surface of the base that becomes the upper ends of the first pin-shaped projections after sanding or grinding is confirmed to have the predetermined protruding shape. By repeating these processes, the curved surface shape is processed to be a desired shape. The curved surface shape being a predetermined protruding shape substantially symmetrical with respect to the center axis denotes that a profile curve of a measured curved surface shape is a curve having a value of Z that is maximum in the vicinity of the center axis and that decreases monotonously toward the outer edge of the base.

Figure 10:
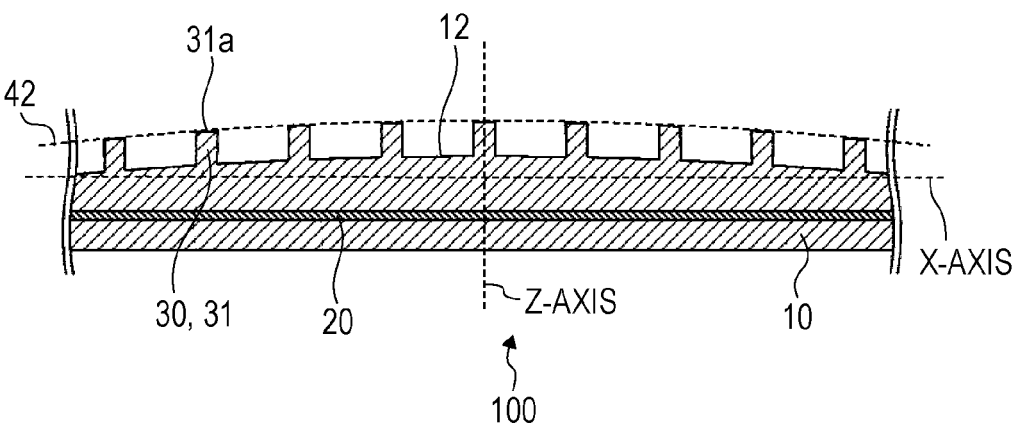
FIG. 10 is a schematic view illustrating one example of a manufacturing process of an electrode-embedded member according to an embodiment of the present invention.

The first pin-shaped projections are formed by forming recesses such that distances from the upper surface of the base to respective upper ends of the first pin-shaped projections are substantially equal to each other. The second pin-shaped projections 32 are also processed by the same method as the method for the first pin-shaped projections 31. As illustrated in FIG. 10, the heights of all of the pin-shaped projections are substantially equal to each other at a stage in which formation of the first pin-shaped projections is finished. In other words, as a result of digging the surface that becomes the upper ends of the first pin-shaped projections to the same depth, a plurality of pin-shaped projections are formed. A bottom surface formed by digging becomes the upper surface of the base. As a method of forming the first pin-shaped projections, blasting, milling, laser processing, or the like can be employed. A processing depth GB is preferably 5 μm or more and 300 μm or less and more preferably 50 μm or more and 200 μm or less. It is possible to confirm that the curved surface shape formed by the processed first pin-shaped projections is a predetermined curved surface shape by causing a substrate placed on the first pin-shaped projections to be attracted and measuring a surface opposite to the attracted surface by a laser interferometer. When the curved surface shape is slightly displaced from the predetermined curved surface shape, the predetermined curved surface shape is obtained by performing correction processing.

Next, the pin-shaped projections 30 positioned in the ring-shaped area RA are processed to have heights lower than the height of each first pin-shaped projection to serve as the second pin-shaped projections 32. The ring-shaped area RA is determined on the basis of a measurement result, a simulation, and the like of a temperature distribution. As a method of forming the second pin-shaped projections, MC processing or the like can be employed. Preferably, this formation is performed to satisfy $\Delta H > \Delta G \geq 0.5 \times \Delta H$ where $\Delta G$ is a difference between the height of each first pin-shaped projection 31 and the height of the second pin-shaped projections whose height is lowest, and $\Delta H$ is a difference in the vertical direction between the upper end of the first pin-shaped projection closest to the center 16 of the base 10 and the upper end of the first pin-shaped projection 31 closest to the outer edge 18 of the base 10.

As necessary, an air hole, an annular projection, and the like may be formed. Consequently, a ceramic base including an electrode that is embedded in the inside thereof and a plurality of pin-shaped projections that are formed on one major surface thereof can be prepared.

Lastly, the terminal is connected to the terminal hole by a brazing material or the like. A terminal of Ni or the like is usable. A brazing material of Au or the like is usable.

An electrode-embedded member according to an embodiment of the present invention can be manufactured as described above.

3. Method of Manufacturing Substrate Holding Member

A ceramic compact that becomes, after being baked, the supporting member is formed from granulated powder obtained by granulating ceramic powder. A main component of the ceramic powder is preferably identical to that of the ceramic powder used in the electrode-embedded member.

Next, a degreased ceramic body is prepared by subjecting the ceramic compact to degreasing at a predetermined temperature or more for a predetermined time or more. For example, through heating at a temperature of 400° C. or more and 800° C. or less, a degreased ceramic body is obtained. The degreasing time is preferably 1 hour or more and 120 hours or less. Although a dry oven or a nitrogen atmosphere oven is usable for decreasing, a dry oven is preferable.

Next, the supporting member that supports an electrode-embedded member is formed by baking the degreased ceramic body. Baking for the supporting member is preferably normal-pressure baking. The baking temperature is preferably 1500° C. or more and 2000° C. or less. The baking time is preferably 1 hour or more and 12 hours or less. The baking atmosphere is, for example, a nitrogen or inert gas atmosphere and may be a vacuum atmosphere or the like.

The supporting member is disposed at a predetermined position on the lower surface of the electrode-embedded member and heated while being pressed against the bonding surface in the perpendicular direction to thereby bond the electrode-embedded member and the supporting member to each other. The force of pressing is preferably 1 MPa or more. The heating temperature is preferably 1500° C. or more and 2000° C. or less. The heating time is preferably 0.5 hours or more and 5 hours or less. The heating atmosphere is, for example, a nitrogen or inert gas atmosphere and may be a vacuum atmosphere or the like. Consequently, the substrate holding member body and the supporting member are solid-phase bonded to each other. The bonding means is not limited to solid phase bonding and may be a means with an inorganic bonding material interposed.

Preferably, processing of the upper surface of the base of the electrode-embedded member, formation of the pin-shaped projections, sanding and grinding of the pin-shaped projections, blazing of the terminal, and the like are performed after bonding between the electrode-embedded member and the supporting member.

A substrate holding member, in which an electrode-embedded member and a supporting member are bonded to each other, according to an embodiment of the present invention can be manufactured as described above.

4. Examples and Comparative Example a. Example 1

Example 1 is a substrate holding member that has a placement curved surface having a protruding shape such as that illustrated in FIG. 1. A material of each of a base and a supporting member is constituted by a sintered body that includes aluminum nitride (AlN) as a main component. An electrode has a shape that includes a plurality of circumferential patterns such as those in FIG. 2. A base (electrode-embedded member) in which such a substantially disc-shaped electrode having a diameter of φ320 mm and a thickness of t20 mm is embedded and a supporting member were prepared. After bonding to the supporting member, the upper surface of the base was sanded to be processed into a curved surface having a protruding shape. By subjecting the base in order from an outer edge portion to lap sanding with loose abrasive, the upper surface of the base was processed to be a curved surface in which a profile curve obtained by cutting the curved surface by a cross-section passing through the center axis is line symmetrical with respect to the center axis and decreases monotonously toward the outer edge of the base. The upper surface of the base was formed such that ΔH is 20 μm.

Next, the first pin-shaped projections were formed through grinding by blasting. The first pin-shaped projections were concentrically formed in an area within φ300 mm from the center of the base to each have φ1 mm and a height of 150 μm from the upper surface of the base. The first pin-shaped projections were formed to have a surface roughness Ra of 0.4 μm.

In other words, the substrate holding member in Example 1 is a substrate holding member processed such that, with the center axis of the base being set as a Z-axis, when a placement curved surface constituted by the upper ends of the first pin-shaped projections is cut by a cross-section passing through the Z-axis to obtain a profile curve, and when a line of intersection between a predetermined reference surface and the cross-section is an X-axis, the profile curve is a curve having a value of Z that is maximum in the vicinity of the center axis and that decreases monotonously toward the outer edge of the base.

Next, the second pin-shaped projections were formed by subjecting the plurality of pin-shaped projections disposed in the ring-shaped area RA to MC processing. This processing was performed such that ΔG is 12 μm and that the surface roughness Ra of the second pin-shaped projections is 1.0. The ring-shaped area RA was an area having a radius of 33 mm or more and 52 mm or less from the center of the base.

b. Example 2

Except for ΔH set to 15 μm and ΔG set to 5 μm, a substrate holding member was prepared under the same conditions as those in Example 1.

c. Example 3

Except for ΔH set to 50 μm and ΔG set to 25 μm, a substrate holding member was prepared under the same conditions as those in Example 1.

d. Example 4

Except for ΔH set to 5 μm and ΔG set to 3 μm, a substrate holding member was prepared under the same conditions as those in Example 1.

e. Example 5

Except for ΔH set to 3 μm and ΔG set to 1 μm, a substrate holding member was prepared under the same conditions as those in Example 1.

f. Comparative Example 1

Except for the second pin-shaped projections not formed, a substrate holding member was prepared under the same conditions as those in Example 1.

5. Method of Measuring Placement Curved Surface

A substrate (silicon wafer) that has φ300 mm and a thickness of 0.775 mm and that has a surface coated with 30 μm of a black body (a commercially available spray having emissivity of 92%) was placed on each of the substrate holding members obtained in the examples and the comparative example. Then, a surface (a surface of the substrate) on the side opposite to the side of a placement curved surface was measured by a laser interferometer. At this time, presence/absence of a point of inflection in areas other than the ring-shaped area was confirmed.

Next, by using values measured by the laser interferometer, an approximate expression of each of Example 1 and Comparative Example 1 when a profile curve was subjected to quadratic curve approximation where the unit of Z was μm and the units of X and Y were mm was calculated. Then, a quadratic coefficient of an approximate quadratic curve, and a determination coefficient $R^2$ were calculated.

6. Method of Evaluation

The substrate was placed on each of the substrate holding members of Example 1 and Comparative Example 1. The temperature of a center portion of the substrate was set to 400° C. and controlled by applying a voltage to an inner electrode. At this time, a temperature distribution on the substrate was measured by using an infrared camera disposed above the substrate. A value obtained by deducting the lowest temperature from the highest temperature in an area of φ290 mm except for 5 mm from the outer edge of the substrate was considered as a temperature difference ΔT. The temperature difference ΔT of 5.0° C. or less was evaluated as good and acceptable, and the temperature difference ΔT of more than 5.0° C. and equal to or less than 7.0° C. was evaluated as fair and acceptable. The temperature difference ΔT of more than 7.0° C. was evaluated as poor and unacceptable.

7. Results of Evaluation

Table 1 shows various measurement results in the examples and the comparative example. The "evaluation" denotes results of evaluation of the temperature difference ΔT based on the evaluation standard described above.

TABLE 1

|  | Example 1 | Example 2 | Example 3 | Example 4 | Example 5 | Comp. Example 1 |
|---|---|---|---|---|---|---|
| ΔH (μm) | 20 | 15 | 50 | 5 | 3 | 20 |
| ΔG (μm) | 12 | 5 | 35 | 3 | 1 | — |
| Temperature Difference ΔT (° C.) | 3.5 | 3.9 | 3.7 | 4.6 | 6.2 | 7.2 |
| Temperature Difference (° C.) in Radial Direction in Ring-Shaped Area RA | 0.5 | 0.6 | 0.5 | 0.7 | 1.0 | 2.1 |
| Evaluation | good | good | good | good | fair | poor |
| Quadratic Coefficient of Approximate Quadratic Curve in X-Axis Direction | −9.5e−4 | −7.1e−4 | −2.37e−3 | −2.38e−4 | −1.4e−4 | −9.5e−4 |
| Quadratic Coefficient of Approximate Quadratic Curve in Y-Axis Direction | −9.2e−4 | −7.0e−4 | −2.32e−3 | −2.30e−4 | −1.6e−4 | −9.4e−4 |
| $2(a(X) - a(Y))/(a(X) + a(Y))$ | 0.032 | 0.014 | 0.021 | 0.034 | 0.133 | 0.011 |
| Determination Coefficient $R^2$ in X-Axis Direction | 0.99 | 0.99 | 0.99 | 0.99 | 0.88 | 0.99 |
| Determination Coefficient $R^2$ in Y-Axis Direction | 0.99 | 0.99 | 0.99 | 0.99 | 0.86 | 0.99 |
| Presence/Absence of Inflection Point in Areas Other Than Ring-Shaped Area | No | No | No | No | Yes | No |

In Examples 1 to 5, the temperature difference ΔT was 7.0° C. or less, and it was recognized that a substantially uniform temperature distribution was shown. In addition, it was possible to sufficiently reduce the temperature difference in the radial direction of the ring-shaped area RA. Thus, it is considered to be also possible to provide a predetermined temperature gradient in the radial direction in accordance with the design of the pin-shaped projections and the like.

Example 5, in which ΔH and ΔG do not satisfy the condition that ΔH>ΔG≥0.5×ΔH, did not satisfy the condition that the temperature difference ΔT is 5.0° C. or less but satisfied the condition that the temperature difference ΔT is more than 5.0° C. and equal to or less than 7.0° C. It was thus recognized that a temperature distribution that was uniform to some extent was shown. In Example 5, since the value of ΔH was too small, it was difficult to perform processing without causing a point of inflection in the profile curve.

In contrast, Comparative Example 1, in which the second pin-shaped projections were not formed, did not satisfy the condition that the temperature difference ΔT is 7.0° C. or less. This is considered to be caused by a heater pattern that affects the substrate due to the second pin-shaped projections not formed in the ring-shaped area.

From the above, it is confirmed that the electrode-embedded member and the substrate holding member according to the present invention can equalize a local temperature distribution on a substrate in the radial direction.

Needless to say, the present invention is not limited to the embodiments described above and includes various modifications and equivalents included in the spirit and the scope of the present invention. In addition, the structure, the shape, the number, the position, the size, and the like of each component in the drawings are illustrated for convenience and can be changed, as appropriate.

What is claimed is:

1. An electrode-embedded member comprising:
a disc-shaped base including a ceramic sintered body;
an electrode embedded in the base; and
a plurality of pin-shaped projections that project upward from an upper surface of the base, wherein the upper surface of the base is a curved surface having a shape protruding toward a center of the base,
wherein the plurality of pin-shaped projections include
first pin-shaped projections whose heights from the upper surface to respective upper ends are substantially identical to each other, and
second pin-shaped projections whose heights from the upper surface to respective upper ends are each lower than the height of each of the first pin-shaped projections, and
wherein the second pin-shaped projections are disposed in a ring-shaped area in the upper surface surrounded by concentric circles centered at the center,
wherein ΔH>ΔG≥0.5×ΔH is satisfied where
ΔG is a difference between the height of each of the first pin-shaped projections and the height of, among the second pin-shaped projections, the second pin-shaped projection whose height is lowest, and
ΔH is a difference in a vertical direction between the upper end of the first pin-shaped projection that is closest to the center of the base and the upper end of the first pin-shaped projection that is closest to an outer edge of the base.

2. An electrode-embedded member comprising:
a disc-shaped base including a ceramic sintered body;
an electrode embedded in the base; and
a plurality of pin-shaped projections that project upward from an upper surface of the base,
wherein the upper surface of the base is a curved surface having a shape protruding toward a center of the base,
wherein the plurality of pin-shaped projections include
first pin-shaped projections whose heights from the upper surface to respective upper ends are substantially identical to each other, and
second pin-shaped projections whose heights from the upper surface to respective upper ends are each lower than the height of each of the first pin-shaped projections, and
wherein the second pin-shaped projections are disposed in a ring-shaped area in the upper surface surrounded by concentric circles centered at the center, wherein, with a vertical straight line that passes through the center of the base being set as a center axis, when a placement curved surface constituted by the upper ends of the first pin-shaped projections is cut by mutually orthogonal two cross-sections that pass through the center axis to obtain two profile curves, a determination coefficient $R^2$ with respect to an approximate expression when one of the profile curves is subjected to quadratic curve approximation and a determination coefficient $R^2$ with respect to an approximate expression when another of the profile curves is subjected to quadratic curve approximation are each 0.99 or more.

3. A substrate holding member comprising:

the electrode-embedded member according to claim 1 or claim 2; and a supporting member that is bonded to a lower surface of the base opposite to the upper surface and that supports the electrode-embedded member.

4. A ceramic heater comprising:

the substrate holding member according to claim 3, wherein the electrode is a heater electrode.

5. An electrostatic chuck comprising:

the substrate holding member according to claim 3, wherein the electrode is a heater electrode, and wherein the substrate holding member further includes an electrostatic attraction electrode.

* * * * *